(12) United States Patent
Takami

(10) Patent No.: US 7,512,760 B2
(45) Date of Patent: Mar. 31, 2009

(54) MEMORY CONTROL UNIT AND MEMORY SYSTEM

(75) Inventor: Isao Takami, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 385 days.

(21) Appl. No.: 11/349,908

(22) Filed: Feb. 9, 2006

(65) Prior Publication Data
US 2006/0202232 A1 Sep. 14, 2006

(30) Foreign Application Priority Data
Feb. 25, 2005 (JP) ............... 2005-050738

(51) Int. Cl.
G06F 12/00 (2006.01)
(52) U.S. Cl. .............. 711/163; 713/173; 257/209
(58) Field of Classification Search ............ 711/163; 713/173; 257/209
See application file for complete search history.

(56) References Cited

U.S. PATENT DOCUMENTS 6,292,422 B1 * 9/2001 Pitts ................. 365/225.7
2003/0223281 A1 * 12/2003 Roohparvar ............... 365/200
2004/0088558 A1 * 5/2004 Candelore .................. 713/193
2005/0228980 A1 * 10/2005 Brokish et al. ............... 713/2

FOREIGN PATENT DOCUMENTS

JP 11-175404 7/1999

* cited by examiner

Primary Examiner—Kevin Ellis
Assistant Examiner—Hashem Farrokh
(74) Attorney, Agent, or Firm—Studebaker & Brackett PC; Donald R. Studebaker

(57) ABSTRACT

A memory control unit includes fuses that are selectively blown to set a manufacturer's identification code (ID), and a further fuse that is selectively blown to designate the memory control unit as a general-purpose unit or a custom unit. When designated as a custom unit, the memory control unit uses the manufacturer's ID to protect data in the memory by scrambling the data, or by comparing the manufacturer's ID with an input ID and disabling access to the memory if the ID's do not match. A semiconductor integrated circuit chip including the memory control unit can thus be fuse-programmed for either general-purpose use or custom use.

17 Claims, 8 Drawing Sheets

MEMORY CONTROL UNIT AND MEMORY SYSTEM

BACKGROUND OF THE INVENTION

1. Field of the Invention

The present invention relates to a memory control unit that controls the reading and writing of data in a semiconductor memory, and to a memory system including the memory control unit and the semiconductor memory.

2. Description of the Related Art

Many electronic devices include an embedded microelectronic computing device comprising a microprocessor unit and a memory control unit or memory system. The memory system may include a general-purpose memory controller residing in a large-scale semiconductor integrated circuit chip (hereinafter, microchip), to which external semiconductor memory such as read-only memory (ROM) or random-access memory (RAM), or both, is connected; alternatively, the memory controller, ROM, and RAM may all be part of the same microchip.

FIG. 11 illustrates the general structure of a conventional memory of the type in which the memory controller 20 resides in one chip and the external memory 21 in one or more other chips. Access to the external memory 21 is enabled by an enable signal (a chip select signal CS) output from the memory controller 20. Read access or write access is selected by a read/write control signal output by the memory controller 20. In write access, the external memory 21 stores data transferred from the memory controller 20 at a location designated by an eight-bit address (addr) output by the memory controller 20. In read access, the external memory 21 transfers the data currently stored at the designated address to the memory controller 20.

One function of the memory controller 20 is thus to use the enable signal, the read/write signal, and the address signals to control the operation of the external memory 21. Another function is to send data to the external memory 21 and receive data from the external memory 21. Yet another function that may be carried out by the memory controller 20 is to protect the security of the data stored in the external memory 21 by shuffling the address signals, as described in Japanese Patent Application Publication No. H11-175404.

A weakness of this conventional memory system is that since the external memory 21 is externally connected to the memory controller 20, a third party can easily copy the entire contents of the external memory 21 into another external memory. If the memory controller 20 is part of a commercially available general-purpose microchip, the third party can then obtain an identical microchip and connect it to the unauthorized copy of the external memory to duplicate the entire memory system.

One way to thwart this type of unwanted duplication is to customize the microchip that includes the memory controller 20 by adding special features such that software stored in the external memory 21 can be executed by the customized microchip, but not by commercially available general-purpose microchips. This scheme is expensive, however, because the modifications required for customization are complex.

Somewhat similar problems arise when the memory and memory controller are on the same chip. To protect the data in the memory, the memory controller must be provided with special features that make the chip more expensive to manufacture.

SUMMARY OF THE INVENTION

An object of the present invention is to provide a simple way to enhance the security of data stored in a semiconductor memory.

The invention provides a memory control unit for reading and writing data in a semiconductor memory. A manufacturer's identification (ID) setting block in the memory control unit has fuses that are selectively blown to set a manufacturer's identification code. A decustomizing block has a fuse that is blown or left intact to designate the memory control unit as a custom unit or a general-purpose unit. When designated as a custom unit, the memory control unit uses the manufacturer's identification code to protect the data in the memory.

According to one aspect of the invention, the memory control unit also includes a scrambler. When the decustomizing block designates the memory control unit as a custom unit, the scrambler uses the manufacturer's identification code to scramble the data output from the memory control unit to the memory, and to descramble data input from the memory to the memory control unit. When the decustomizing block designates the memory control unit as a general-purpose unit, the input and output data are not scrambled and descrambled. This aspect of the invention is particularly applicable when the memory is external to the microchip that includes the memory control unit.

According to another aspect of the invention, a manufacturer's ID register block in the memory control unit stores an input identification code. A manufacturer's ID comparator compares the input identification code with the manufacturer's identification code. If the two identification codes do not match, or if the decustomizing block designates the memory control unit as a general-purpose unit, the manufacturer's ID comparator blocks output of an enable signal to the memory, thereby preventing access to the memory. This aspect of the invention is particularly applicable when the memory is internal to the microchip that includes the memory control unit.

Both aspects of the invention provide ways to protect data in the memory by simple fuse-programming operations. A microchip including the memory control unit can be provided both as a custom device to specific manufacturers who put proprietary software or data in the memory, and as a general-purpose device to customers who do not require data protection.

DETAILED DESCRIPTION OF THE INVENTION

Figure 1:
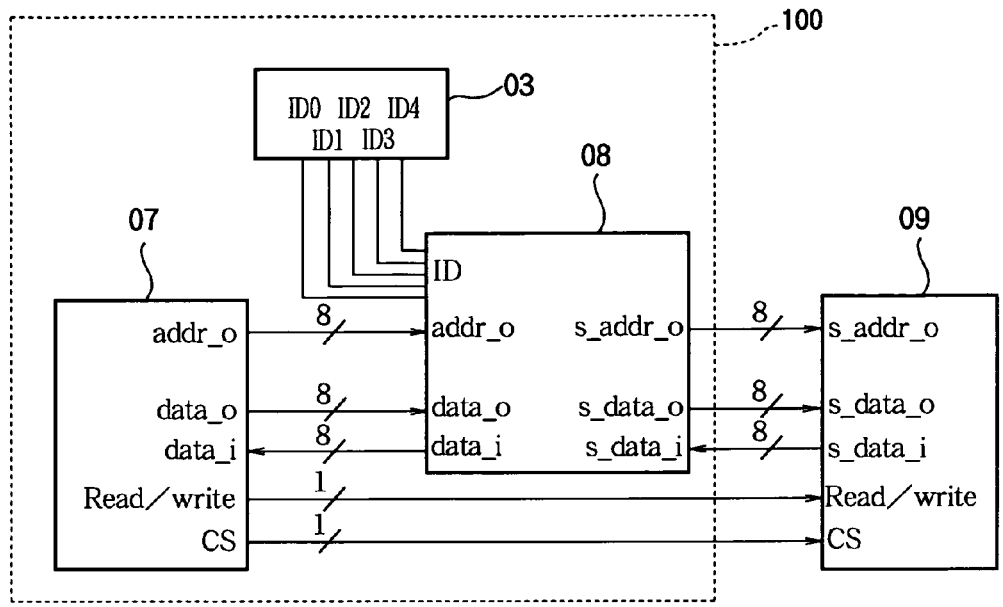
FIG. 1 is a block diagram of a memory system according to a first embodiment of the invention.

Embodiments of the invention will now be described with reference to the attached drawings, in which like elements are indicated by like reference characters.

First Embodiment

Referring to FIG. 1, the memory system in the first embodiment comprises a manufacturer's ID output block 03, a memory controller 07, a scrambler 08, and an external memory 09. The manufacturer's ID output block 03, memory controller 07, and scrambler 08 are embedded in a single microchip 100 and constitute a memory control unit. The external memory 09 is external to the microchip 100. The operation of the memory system is controlled by a central processing unit (CPU), which may be part of the microchip 100 or external to the microchip 100.

The manufacturer's ID output block 03 sends five one-bit output signals (ID0, ID1, ID2, ID3, ID4) to the scrambler 08.

Figure 11:
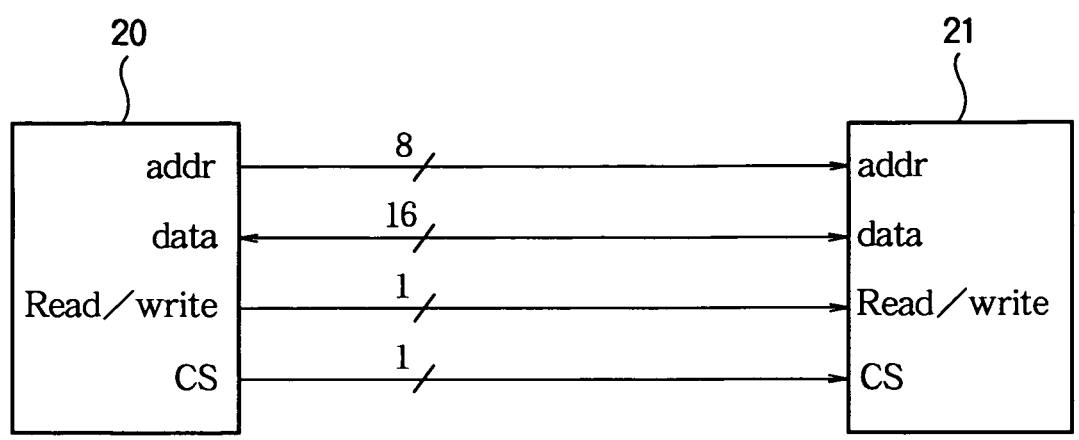
FIG. 11 is a block diagram of a conventional memory system.

The memory controller 07 sends a chip enable signal or chip select signal (CS) and a read/write control signal to the external memory 09, sends eight address bits (addr_o) and eight write data bits (data_o) to the scrambler 08, and receives eight read data bits (data_i) from the scrambler 08. The memory controller 07 is a general-purpose circuit similar to the conventional memory controller 20 in FIG. 11, and will not be described in detail.

The scrambler 08 scrambles the address bits and write data, sends a scrambled eight-bit address (s_addr_o) and scrambled eight-bit write data (s_data_o) to the external memory 09, receives scrambled eight-bit read data (s_data_i) from the external memory 09, and descrambles the scrambled read data to obtain the read data (data_i) sent to the memory controller 07. The scrambling and descrambling operations are performed according to the signals (ID0, ID1, ID2, ID3, ID4) output by the manufacturer's ID output block 03. When these output signals are all '0', the scrambled address (s_addr_o) is identical to the non-scrambled address (addr_o), and the scrambled and non-scrambled data are mutually identical.

Figure 2:
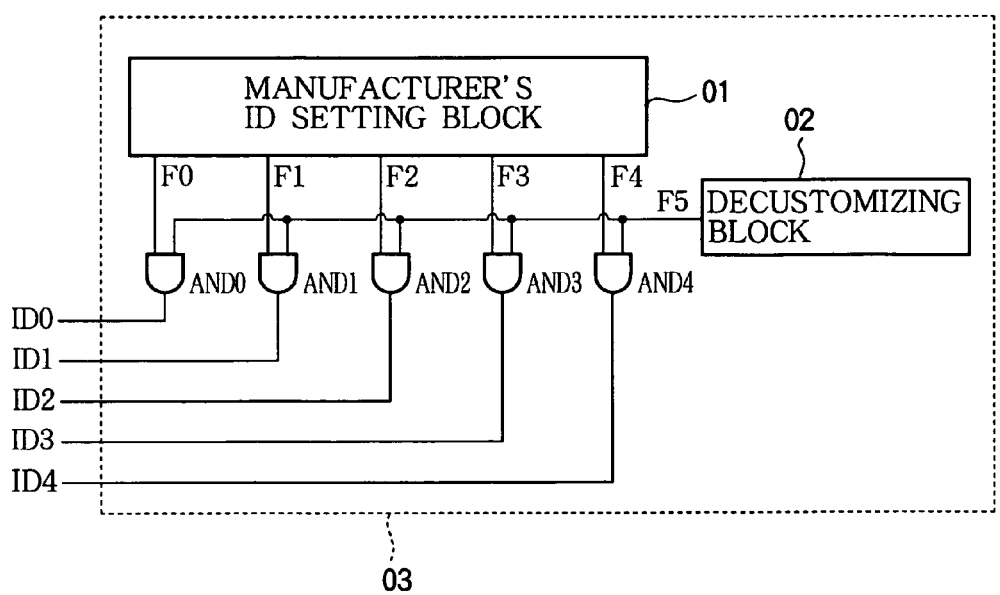
FIG. 2 is a block diagram of the manufacturer's ID output block in FIG. 1.

Referring to FIG. 2, the manufacturer's ID output block 03 comprises a manufacturer's ID setting block 01, a decustomizing block 02, and five two-input AND gates (AND0, AND1, AND2, AND3, AND4).

The manufacturer's ID setting block 01 outputs manufacturer's identification (ID) signals (F0, F1, F2, F3, F4) to the corresponding AND gates AND0 to AND4. Each AND gate also receives a decustomizing signal F5 output by the decustomizing block 02. The outputs of AND gates AND0 to AND4 become the output signals (ID0, ID1, ID2, ID3, ID4) of the manufacturer's ID output block 03.

Figure 3:
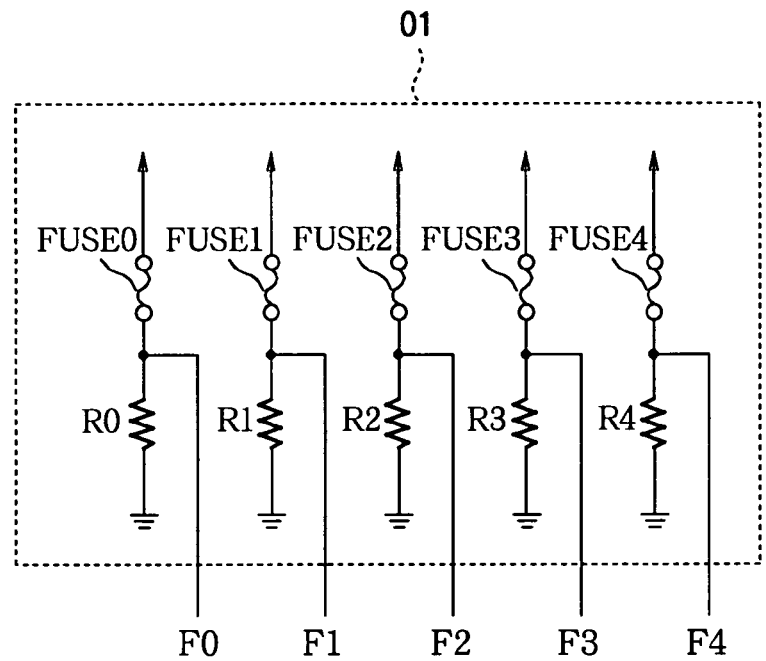
FIG. 3 is a circuit diagram of the manufacturer's ID setting block in FIG. 2.

Referring to FIG. 3, the manufacturer's ID setting block 01 comprises resistors (R0, R1, R2, R3, R4) connected in series with respective manufacturer's ID fuses (FUSE0, FUSE1, FUSE2, FUSE3, FUSE4). The manufacturer's ID signals F0 to F4 output by the manufacturer's ID setting block 01 are the output signals from pull-up circuits each comprising one resistor and one manufacturer's ID fuse.

Figure 4:
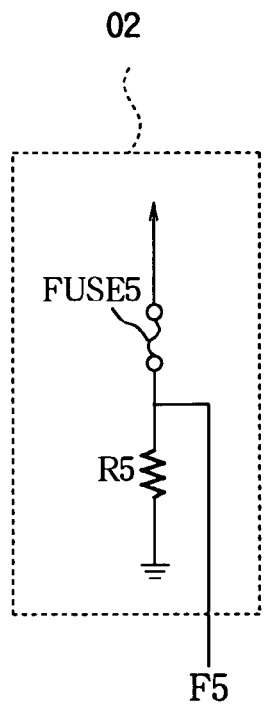
FIG. 4 is a circuit diagram of the decustomizing block in FIG. 2.

Referring to FIG. 4, the decustomizing block 02 has a decustomizing fuse (FUSE5) and a resistor (R5) connected in series. Like the manufacturer's ID signals F0 to F4 in FIG. 3, the decustomizing signal F5 output by the decustomizing block 02 is the output signal from a pull-up circuit, formed in this case by resistor R5 and the decustomizing fuse.

Figure 5:
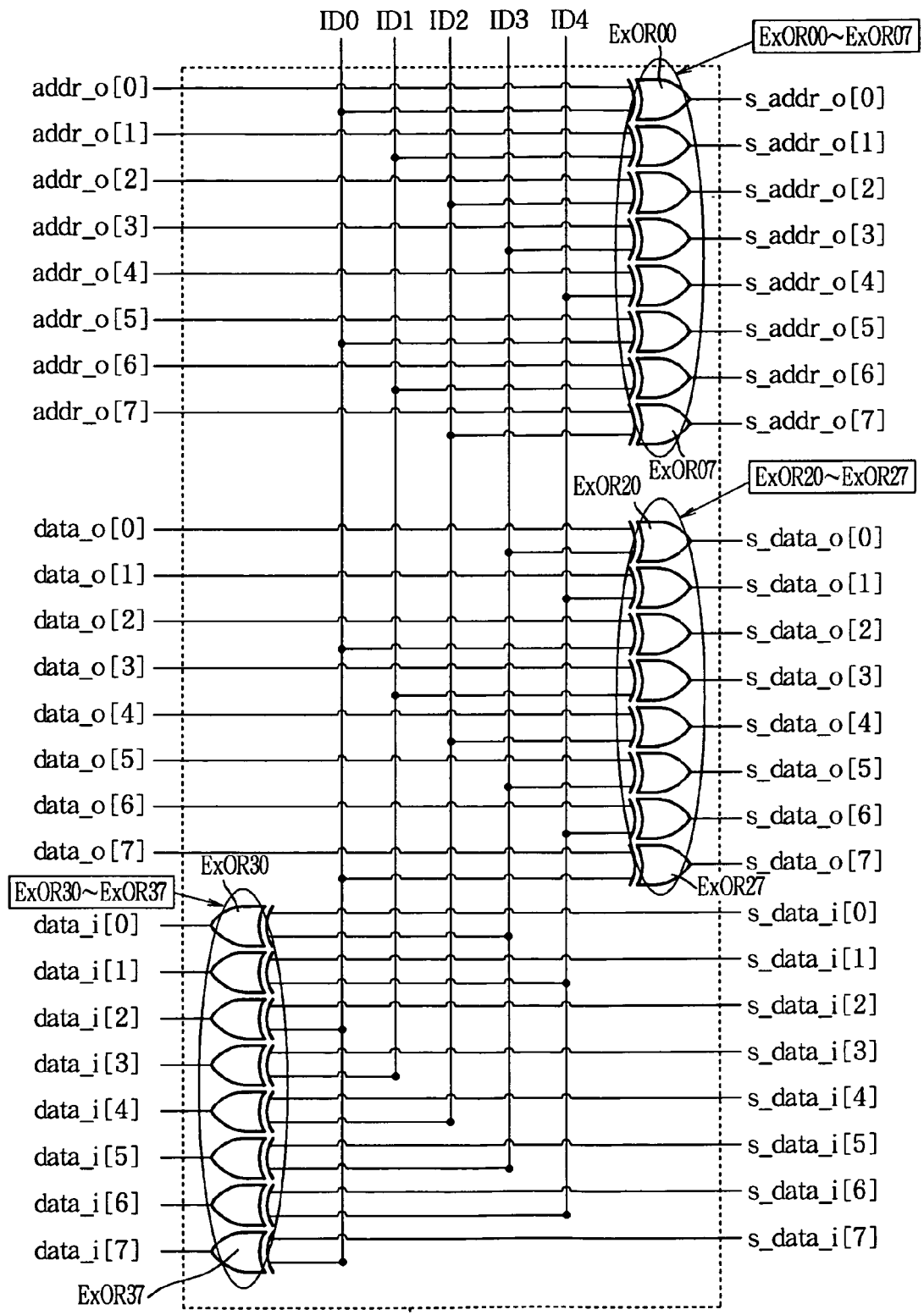
FIG. 5 is a circuit diagram of the scrambler in FIG. 1.

Referring to FIG. 5, the scrambler 08 comprises three sets of two-input exclusive-OR gates (ExOR00, ExOR01, . . . , ExOR07; ExOR20, ExOR21, . . . , ExOR27; ExOR30, ExOR31, . . . , ExOR37).

Exclusive-OR gates ExOR00 to ExOR07 receive respective address bits addr_o[0] to addr_o[7] from the memory controller 07, and each exclusive-OR gate receives one of the output signals ID0 to ID4 from the manufacturer's ID output block 03. The outputs of exclusive-OR gates ExOR00 to ExOR07 are the eight scrambled address bits s_addr_o[0] to s_addr_o[7].

As there are eight address bits addr_o[0] to addr_o[7] and only five ID output signals ID0 to ID4, three of the ID output signals (ID0, ID1, ID2) are input to two exclusive-OR gates. Specifically, exclusive-OR gates ExOR00 to ExOR07 receive ID output signals ID0, ID1, ID2, ID3, ID4, ID0, ID1, ID2, respectively.

Similarly, exclusive-OR gates ExOR20 to ExOR27 receive respective write data bits data_o[0] to data_o[7] from the memory controller 07 and respective ID output signals from the manufacturer's ID output block 03. The outputs of exclusive-OR gates ExOR20 to ExOR27 are the eight scrambled write data bits s_data_o[0] to s_data_o[7]. Exclusive-OR gates ExOR30 to ExOR37 receive respective scrambled read data bits s_data_i[0] to s_data_i[7] output from the external memory and respective ID output signals from the manufacturer's ID output block 03. The outputs of exclusive-OR gates ExOR30 to ExOR37 are the eight read data bits data_i[0] to data_i[7]. The ID output signals ID0 to ID4 are connected to exclusive-OR gates ExOR20 to ExOR27 and to exclusive-OR gates ExOR30 to ExOR37 in the same order as to exclusive-OR gates ExOR00 to ExOR07, ID0, ID1, and ID2 being used twice in each case.

The operation of the memory system according to the first embodiment will be described below.

First, the microchip manufacturer assigns different ID codes are assigned to different electronic equipment manufacturers who purchase microchips including the memory control unit. When microchips are fabricated for one of these manufacturers, the assigned manufacturer's ID code is programmed into the memory control unit by selectively blowing the manufacturer's ID fuses FUSE0 to FUSE4 in the manufacturer's ID setting block 01 (see FIG. 3) to enable or disable the pull-up circuits. A pull-up circuit in which the fuse is left intact outputs a high logic level (logical '1') due to the voltage generated across the resistor, whereas a pull-up circuit in which the fuse is blown outputs a low logic level (logical '0') because the resistor pulls the output down to the ground level. The fuses are programmed so that the manufacturer's ID setting block 01 outputs manufacturer's ID signals F0 to F4 matching the manufacturer's ID code. The decustomizing fuse FUSE5 in the decustomizing block 02 (see FIG. 4) is left intact, so that the decustomizing signal F5 is '1'.

When microchips are fabricated for the general market instead of for a specific manufacturer, the decustomizing fuse FUSE5 in the decustomizing block 02 (see FIG. 4) is blown to set the decustomizing signal F5 to '0'. The manufacturer's ID fuses may also be blown to eliminate current consumption by the manufacturer's ID output block 03.

As shown in FIG. 2, the AND gates AND0 to AND4 in the manufacturer's ID output block 03 take the logical AND of the manufacturer's ID signals F0 to F4 and the decustomizing signal F5. When the decustomizing signal F5 is logical '1', indicating a custom unit, the manufacturer's ID signals F0 to F4 are output from the manufacturer's ID output block 03 as the output signals ID0 to ID4. When the decustomizing signal F5 is '0', designating a general-purpose unit, the output signals ID0 to ID4 of the manufacturer's ID output block 03 are all '0'. The output signals ID0 to ID4 are input to the scrambler 08 (see FIG. 5) as a scramble key.

As shown in FIG. 5, the scrambler 08 uses the scramble key bits ID0 to ID4 to perform exclusive-OR operations on the address input (addr_o) and write data input (data_o) from the memory controller 07 and the scrambled read data input (s_data_i) from the external memory 09, obtaining the scrambled address output (s_addr_o), scrambled write data output (s_data_o), and descrambled read data input (data_i). Each bit in the address input (addr_o), write data input (data_o), and scrambled read data input (s_data_i) that is exclusive-ORed with a '1' in the scramble key is inverted (changed from '0' to '1' or from '1' to '0'), whereas each bit that is exclusive-ORed with a '0' is left uninverted.

When the decustomizing signal F5 designates the memory control unit as a custom unit, the scramble key bits ID0 to ID4 are identical to the manufacturer's ID preset in the manufacturer's ID setting block 01. When data are written, the address (addr_o) and write data (data_o) from the memory controller 07 are both scrambled by the scrambler 08 according to the manufacturer's ID to obtain the scrambled address (s_addr_o) and write data (s_data_o), which are input to the external memory 09 (see FIG. 1). Accordingly, scrambled write data (s_data_o) are written at scrambled addresses (s_addr_o) in the external memory 09.

When data are read, the scrambler 08 performs the same scrambling operation on the address (addr_o) output from the memory controller 07, so that the address (addr_o) is scrambled with the manufacturer's ID to obtain the scrambled address (s_addr_o), input to the external memory 09. The external memory 09 outputs the scrambled write data (s_data_o) written earlier at this scrambled address (s_addr_o) as scrambled read data (s_data_i). The scrambler 08 descrambles the scrambled read data (s_data_i) by using the scrambling key bits ID0 to ID4 (the manufacturer's ID code) to obtain the non-scrambled read data (data_i), which are passed to the memory controller 07.

As described above, when the memory control unit of the first embodiment functions as a custom unit, the scrambler 08 performs scrambling and descrambling operations according to the manufacturer's ID. Therefore, as long as the external memory 09 is connected to the memory control unit, the data written in it can be read properly. If the external memory 09 or a copy thereof is connected to a general-purpose memory control unit, however, the data read from it will be scrambled. A person not knowing the manufacturer's ID code will find it difficult to descramble the data, especially since both data and addresses are scrambled.

When the memory control unit is designated as a general-purpose unit, the scramble key bits ID0 to ID4 are all '0'. The scrambler 08 therefore does not scramble or descramble address bits or bits of read or write data but passes them through without alteration. In write access, the address (addr_o) and write data (data_o) input to the scrambler 08 reach the external memory 09 unchanged. The external memory 09 stores non-scrambled write data (s_data_o=data_o) at non-scrambled addresses (s_addr_o=addr_o). In read access, the address (addr_o=s_addr_o) reaches the external memory 09 unchanged, the external memory 09 outputs the non-scrambled data (s_data_i) stored at this address as read data, and the memory controller 07 receives the unaltered read data (data_i=s_data_i).

When the memory control unit is designated as a general-purpose unit, since the scrambler 08 does not perform scrambling and descrambling operations, the data in the external memory 09 can be read by another general-purpose memory control unit.

The microchip 100 including the memory control unit according to the first embodiment has, for example, the following distribution model. The semiconductor device manufacturer has two customers (a first electronic equipment manufacturer and a second electronic equipment manufacturer) who require customized chips to protect proprietary data that they will store in the external memory, and other customers who do not require customized chips. The semiconductor device manufacturer assigns IDs to the first and second electronic equipment manufacturers and fabricates microchips 100 according to the first embodiment. Some of the fabricated microchips 100 will be shipped to the first electronic equipment manufacturer (first custom chips), others will be shipped to the second electronic equipment manufacturer (second custom chips), and others will be sold indiscriminately as general-purpose chips. In the first custom chips, the fuses in the manufacturer's ID setting block 01 are selectively blown according to the ID code assigned to the first electronic equipment manufacturer, and the fuse in the decustomizing block 02 is left intact. In the second custom chip, the fuses in the manufacturer's ID setting block 01 are selectively blown according to the different ID code assigned to the second electronic equipment manufacturer, and the fuse in the decustomizing block 02 is left intact. In the general-purpose chips, the fuse in the decustomizing block 02 is blown.

The first and second custom chips and general-purpose chips are all fabricated by the same fabrication process; the fuses in the manufacturer's ID setting block 01 or decustomizing block 02 are selectively blown before shipment to differentiate the product types. The semiconductor device manufacturer supplies the first custom chips only to the first electronic equipment manufacturer, supplies the second custom chips only to the second electronic equipment manufacturer, and supplies the general-purpose chips to other electronic equipment manufacturers or sells them commercially.

The first electronic equipment manufacturer produces and distributes electronic products in which the first custom chip (or a memory system using the first custom chip) is embedded; the embedded chip reads and writes data using the first manufacturer's ID as a scramble code. The second electronic equipment manufacturer produces and distributes electronic products in which the second custom chip (or a memory system using the second custom chip) is embedded; the embedded chip in these products reads and writes data using the second manufacturer's ID as a scramble code. Other electronic equipment manufacturers produce and distribute electronic products in which the general-purpose chip (or a memory system using the general-purpose chip) is embedded.

The first and second electronic equipment manufacturers can store programs and other data in the external memory 09 connected to the embedded microchip without risk of unauthorized copying of their products. If necessary, the first and second electronic equipment manufacturer can also change the custom chips supplied from the semiconductor device manufacturer to general-purpose chips by blowing the fuse in the decustomizing block 02 of the custom chips, and produce and distribute electronic equipment product with the general-purpose chip (or a memory system using the general-purpose chip) embedded.

The semiconductor device manufacturer may also provide microchips in which the fuses in the manufacturer's ID setting block 01 and decustomizing block 02 are all left intact to the first and second electronic equipment manufacturers and let them blow the fuses themselves. However, the semiconductor device manufacturer and electronic equipment manufacturers should take care that microchips in which the fuses in the manufacturer's ID setting block 01 and decustomizing block 02 are all left intact do not reach the open market. This is because on the open market, such chips might fall into the hands of a third party who was able to discover one of the manufacturer's ID codes. The third party could then program the chips to operate as custom chips customized with that manufacturer's ID code, to make unlicensed copies of that manufacturer's products or steal the proprietary programs and data.

A memory (the external memory 09) into which data or programs scrambled according to the first embodiment have been written can be read correctly only by a custom chip implementing the same scramble function, with the same manufacturer's ID. The data cannot be read correctly by a customized microchip 100 programmed with a different manufacturer's ID, or by a general-purpose microchip 100. Conversely, a person cannot use a general-purpose microchip 100, or a custom microchip 100 customized with one manufacturer's ID, to generate programs or data for a custom microchip customized with another manufacturer's ID.

In the first embodiment, the same microchip can be made into a custom chip by selectively blowing the fuses in the manufacturer's ID setting block 01 or into a general-purpose chip by blowing the fuse in the decustomizing block 02. When producing custom chips and general-purpose chips, the semiconductor device manufacturer does not need to fabricate the different types of chips separately. The manufacturer can produce just one type of chip, and then customize or decustomize the chip by selectively blowing fuses.

If a chip customized for a specific manufacturer is fabricated by adding a special function to a general-purpose chip as in the conventional art, a separate design and fabrication process is required, increasing the development cost and unit cost of the chip. The first embodiment, in contrast, enables chips to be customized without extra design costs, and the extra cost of programming the fuses in the manufacturer's ID setting block 01 is more than offset by the economy of scale resulting from high-volume production of a single type of chip. The first embodiment thus enables a manufacture to produce customized microchips at a reduced overall cost.

It is impossible to restore fuses once they are blown, so although a custom microchip 100 can be converted to a general-purpose chip, a general-purpose microchip in which the fuse in the decustomizing block 02 has been blown cannot be converted to a custom chip. Therefore, it is not possible for a third party who buys a commercially available general-purpose chip to convert the general-purpose chip to a custom chip and use its scramble function.

Accordingly, as long as custom chips are not sold on the open market, it is impossible to obtain equipment on the market that can correctly read data from a memory into which the data were written using the scramble function of a custom chip. Even if an unauthorized copy of data or program code written into the memory is made, a commercially available general-purpose chip cannot use the unauthorized copy because it cannot descramble the data. Thus a manufacturer who embeds microchips customized according to the first embodiment in his products is not vulnerable to facile piracy of those products.

Examples of products that can usefully employ microchips 100 using the memory control unit or the memory system of the first embodiment include mobile phones, mobile computing devices equipped with communication functions, and game machines.

Mobile phones and mobile computing devices typically have many features implemented by programs stored in a memory such as a ROM. If the stored programs are scrambled according to the first embodiment, they can be executed only by microchips customized with the proper scrambling key, that is, the proper manufacturer's ID. Since microchips customized with the proper manufacturer's ID are not commercially available, potential rivals cannot produce competing products implementing the same features simply by copying the memory contents.

If game programs are stored in the memory of a game machine in the scrambled form described in the first embodiment, unauthorized copies of the game programs cannot be run on game machines made by other manufacturers, because those manufacturers cannot obtain microchips customized or customizable with the proper manufacturer's ID code.

As described above, the first embodiment comprises a manufacturer's ID setting block 01 having fuses used for setting a manufacturer's ID, a decustomizing block 02 having a fuse used for designating the chip as a general-purpose chip or a custom chip, and a scrambler 08 that scrambles addresses and write data using the manufacturer's ID when the chip is designated as a custom chip. Accordingly, even if a program that works with a custom chip is duplicated from the external memory 09 without authorization, the unauthorized duplicate program will not run in a general-purpose system because the program is scrambled.

Since fuses are employed to set the manufacturer's ID and to designate the chip as a general-purpose or custom chip, these settings can be accomplished by blowing the fuses after the chip is fabricated. Accordingly, general-purpose and custom chips can both be fabricated by the same process, and then customized or decustomized by blowing the relevant fuses at the time of packaging or shipment.

The length of the manufacturer's ID is not limited to the five-bit length shown in the first embodiment; an ID code of any length may be used.

The manufacturer's ID setting block 01 may be connected to external terminals of the microchip 100 to permit the manufacturer's ID code to be programmed by the equipment manufacturer who purchases the microchip, as mentioned above. Alternatively, a structure in which the manufacturer's ID setting block 01 is not connected to the external terminals of the microchip 100 may be employed, to prevent tampering with the programmed ID; in this case the fuses must be programmed by the microchip manufacturer.

Similarly, the decustomizing block 02 may be connected to an external terminal of the microchip 100 so that the decustomizing fuse FUSE5 can be blown to convert a custom chip to a general-purpose chip, as mentioned above, without allowing a general-purpose chip to be converted to a custom chip. Alternatively, a structure in which the manufacturer's ID setting block 01 is not connected to an external terminal of the microchip 100 may be employed, to prevent inadvertent or malicious decustomization.

The external memory included in the memory system of the first embodiment may be any type of memory in which data can be written, including, for example, general-purpose dynamic RAM (DRAM), static RAM (SRAM), flash ROM (flash memory), and compact-disc ROM (CD-ROM). DRAM, SRAM, or flash memory chips (or other memory chips) may be permanently installed in the electronic equipment in which the microchip 100 is installed, or the memory chips may be installed in a removable memory device such as a memory card that can be inserted in the electronic equipment.

If data are written into a memory card by using the scramble function of the first embodiment, the data cannot be read correctly by equipment lacking the scramble function or the proper scramble key (the proper manufacturer's ID). This feature can be used to prevent unauthorized importation of data into equipment made by a different manufacturer.

The scrambling method is not restricted. In the above embodiment, the scrambler 08 is configured with exclusive-OR gates, but it is also possible to use a simple bit interchange scheme or a complex encryption algorithm. The scrambler 08 is an encryption means using the manufacturer's ID as an encryption key. Any encryption means, employing any type of encryption technology, may be used as the scrambler 08, provided the means is capable of encrypting data to be sent to the memory and decrypting data read from the memory.

Second Embodiment

Figure 6:
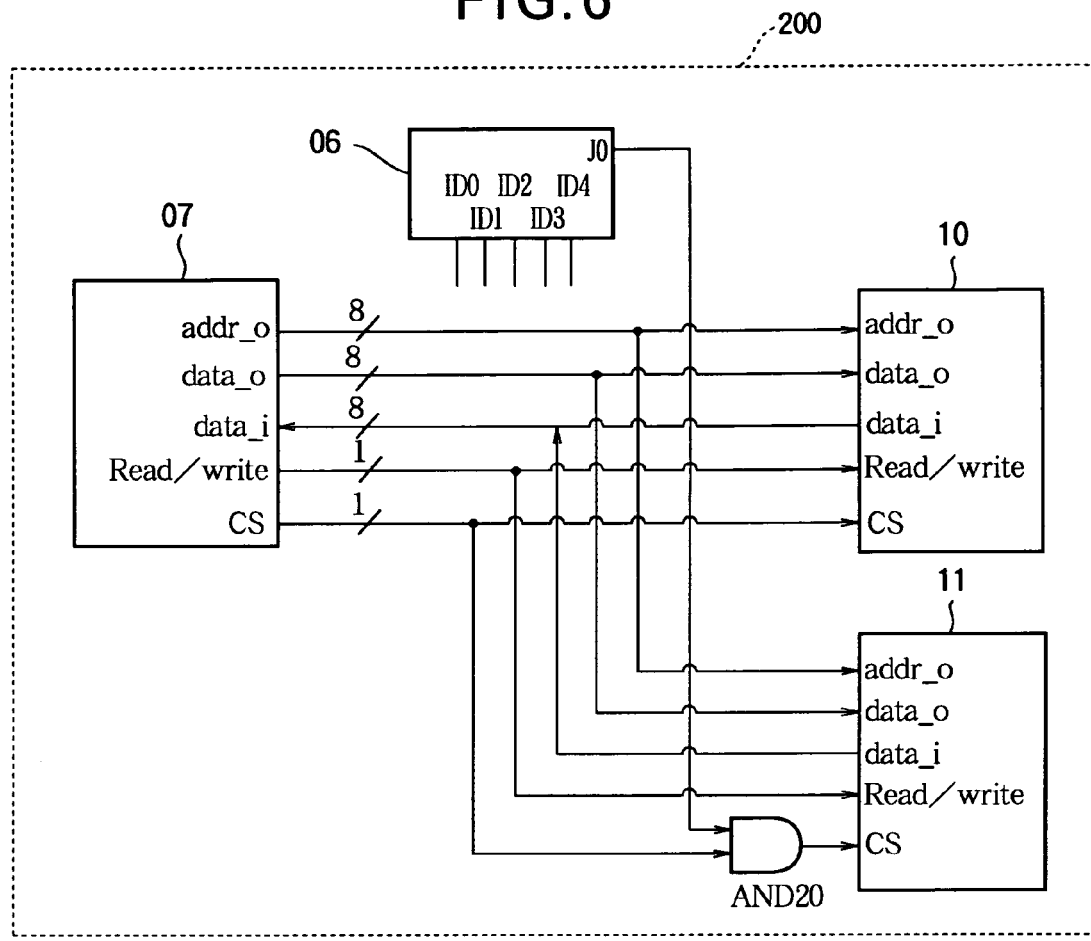
FIG. 6 is a block diagram of a memory system according to a second embodiment of the invention.

Referring to FIG. 6, the memory system in the second embodiment comprises a manufacturer's ID decision block 06, a memory controller 07, a two-input AND gate (AND20), an internal memory 10, and another internal memory 11, all of which form part of a single microchip 200. The manufacturer's ID decision block 06, memory controller 07, and two-input AND gate (AND20) constitute the memory control unit of the second embodiment. The operation of the memory system is controlled by a central processing unit (CPU), which may be part of the microchip 200 or external to the microchip 200.

The manufacturer's ID decision block 06 outputs the same signals ID0 to ID4 as were output by the manufacturer's ID output block in the first embodiment, and also outputs a one-bit manufacturer's ID comparison result signal J0. In generating output signals ID0 to ID4, the manufacturer's ID decision block 06 uses the manufacturer's ID comparison result signal J0 in the same way as the decustomizing signal F5 was used in the first embodiment.

The manufacturer's ID comparison result signal J0 is input to one input terminal of the two-input AND gate (AND20). A one-bit chip enable signal or chip select signal (CS) output by the memory controller 07 is input to the other input terminal of the AND gate (AND20) and to the CS input terminal of internal memory 10. The output signal of the AND gate (AND20) is input to the CS input terminal of internal memory 11. The AND gate (AND20) thus uses the manufacturer's ID comparison result signal J0 as a gating signal to gate the enable signal (CS) output by the memory controller 07.

The memory controller 07 sends a one-bit read/write control signal, eight-bit address (addr_o), and eight-bit write data (data_o) to both internal memories 10, 11. Each internal memory 10, 11 outputs read data (data_i), which are sent to the memory controller 07.

Figure 7:
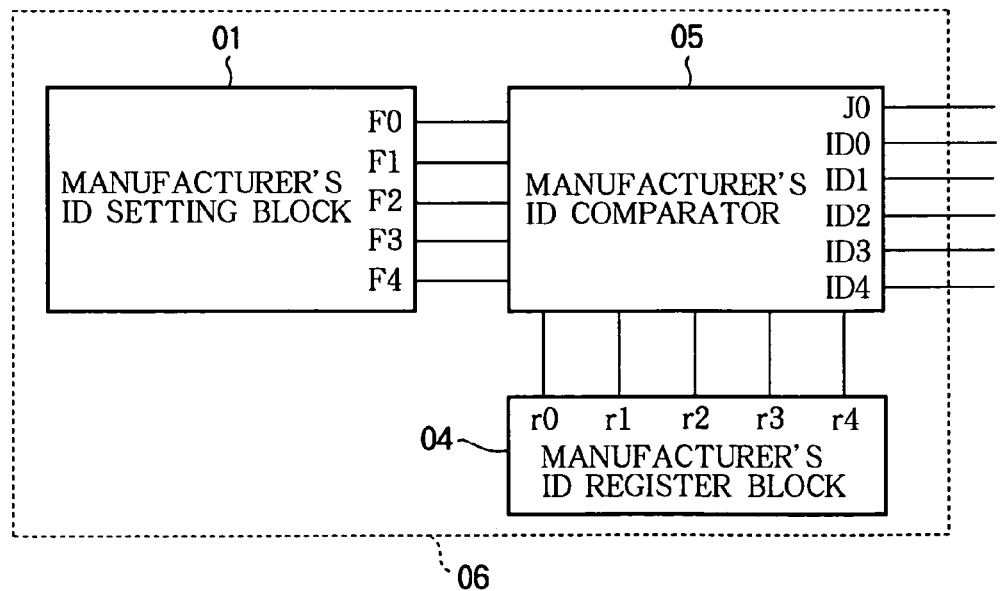
FIG. 7 is a block diagram of the manufacturer's ID decision block in FIG. 6.

Referring to FIG. 7, the manufacturer's ID decision block 06 comprises a manufacturer's ID setting block 01, a manufacturer's ID register block 04, and a manufacturer's ID comparator 05. The AND gate (AND20) in FIG. 6 may be considered as part of the manufacturer's ID comparator 05.

The manufacturer's ID setting block 01 in FIG. 7 has the same structure as in the first embodiment (see FIGS. 2 and 3), and outputs manufacturer's ID signals F0 to F4 to the manufacturer's ID comparator 05. The output signals r0 to r4 of the manufacturer's ID register block 04 are also sent to the manufacturer's ID comparator 05. The manufacturer's ID comparator 05 outputs signals ID0 to ID4 and the manufacturer's ID comparison result signal J0. Signals ID0 to ID4 may be used to scramble and descramble data as in the first embodiment, or to enable and disable access to other on-chip functions as described later, or may be left unused.

Figure 8:
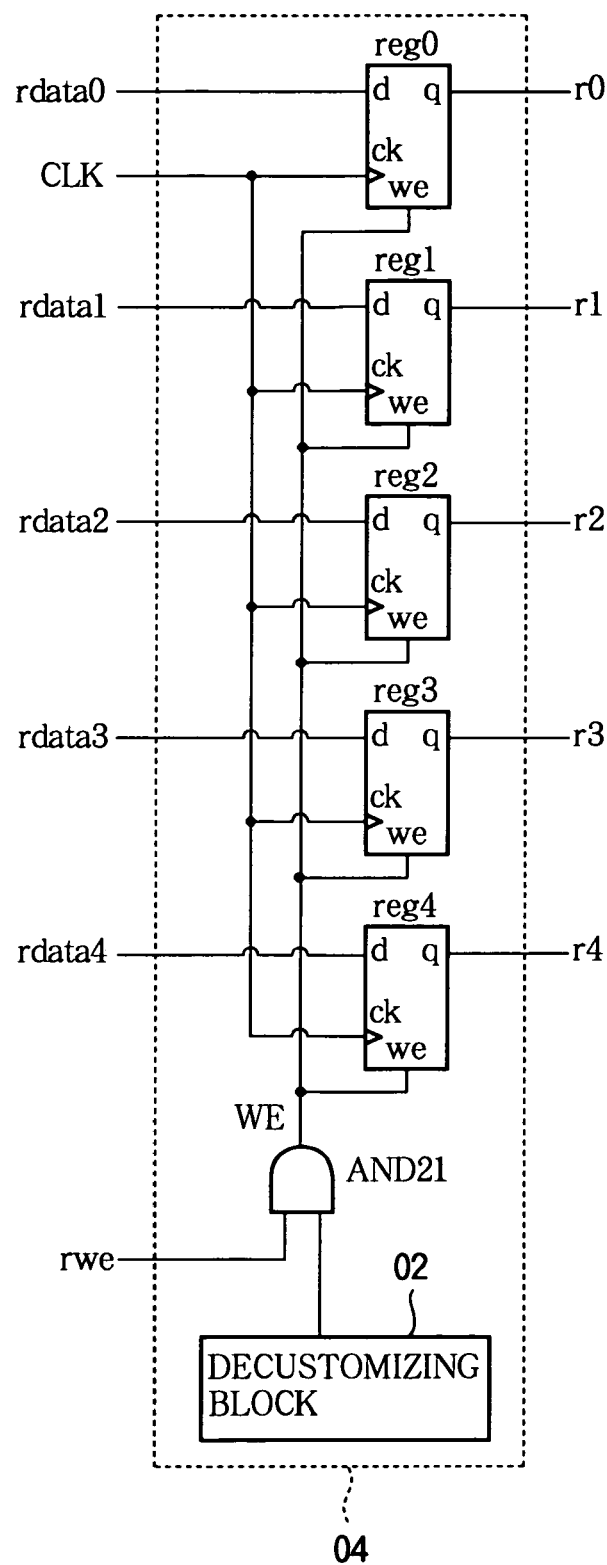
FIG. 8 is a circuit diagram of the manufacturer's ID register block in FIG. 6.

As shown in FIG. 8, the manufacturer's ID register block 04 comprises a decustomizing block 02, five flip-flops (reg0, reg1, reg2, reg3, reg4), and a two-input AND gate (AND21).

The decustomizing block 02 has the same structure as in the first embodiment (see FIGS. 2 and 4), and outputs a decustomizing signal F5, which is input to the two-input AND gate (AND21) together with a manufacturer's ID input data write enable signal (rwe). When the decustomizing fuse FUSE5 is left intact, the decustomizing signal F5 is '1', indicating a custom chip. When the decustomizing fuse FUSE5 is blown, the decustomizing signal F5 becomes '0', indicating a general-purpose chip.

A register write enable signal (WE) output by the AND gate (AND21) is input to each of the write enable terminals (we) of the flip-flops reg0 to reg4. A clock signal CLK is input as a synchronizing signal to the clock terminals (ck) of the flip-flops reg0 to reg4.

Manufacturer's ID input data (rdata0, rdata1, rdata2, rdata3, rdata4) are input to the data input terminals (q) of the respective flip-flops reg0 to reg4. The signals (r0, r1, r2, r3, r4) output from the output terminals (q) of the flip-flops reg0 to reg4 become the output signals of the manufacturer's ID register block 04.

The manufacturer's ID input data rdata0 to rdata4 are independent of the manufacturer's ID preset in the manufacturer's ID setting block 01, and are input separately to the manufacturer's ID register block 04 by, for example, a CPU, disposed in the microchip 200 or another chip, during startup of electronic equipment in which the microchip 200 is embedded. The clock signal CLK and manufacturer's ID input data write enable signal (rwe) are also input to the manufacturer's ID register block 04 by the CPU.

Figure 9:
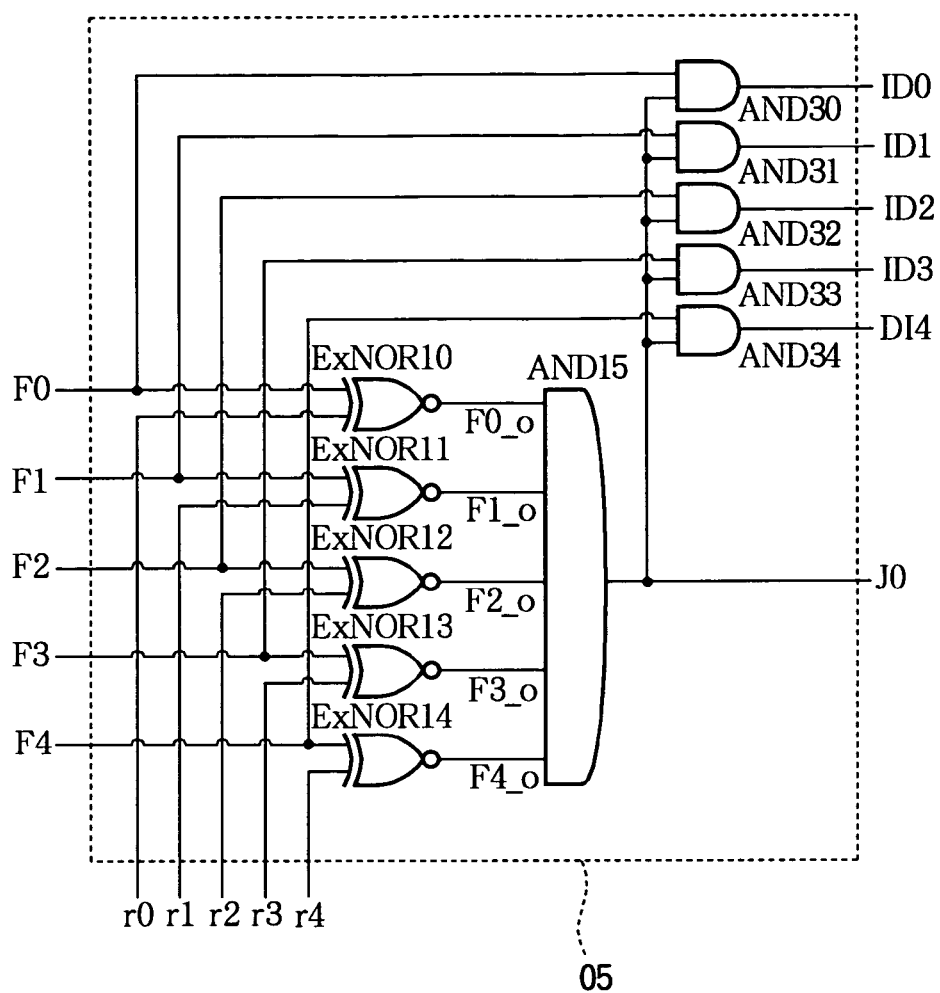
FIG. 9 is a circuit diagram of the manufacturer's ID comparator in FIG. 6.

Referring to FIG. 9, the manufacturer's ID comparator 05 comprises two-input exclusive-NOR gates (ExNOR10, ExNOR11, ExNOR12, ExNOR13, ExNOR14), a five-input AND gate (AND15), and two-input AND gates (AND30, AND31, AND32, AND33, AND34).

The manufacturer's ID signals F0 to F4 output by the manufacturer's ID setting block 01 and the output signals r0 to r4 of the manufacturer's ID register block 04 are input to the corresponding exclusive-NOR gates ExNOR10 to ExNOR14, the output signals (F0_o, F1_o, F2_o, F3_o, F4_o) of which are input to the five-input AND gate (AND15).

The manufacturer's ID signals F0 to F4 output by the manufacturer's ID setting block 01 are also input to the corresponding AND gates AND30 to AND34 together with the manufacturer's ID comparison result signal J0 output by the five-input AND gate (AND15). The manufacturer's ID comparison result signal J0 output by the five-input AND gate (AND15) and the output signals ID0 to ID4 of the AND gates AND30 to AND34 become the output signals of both the manufacturer's ID comparator 05 and the manufacturer's ID decision block 06.

The operation of the memory system in the second embodiment will now be described. The flip-flops reg0 to reg4 in the manufacturer's ID register block 04 of the manufacturer's ID decision block 06 constitute an address-mapped register, and receive the manufacturer's ID input data rdata0 to rdata4 at system start-up.

To allow internal memory 11 to be accessed, two conditions must be met: the manufacturer's ID input data rdata0 to rdata4 must match the manufacturer's ID preset in the manufacturer's ID setting block 01; and the decustomizing block 02 must designate the chip as a custom chip (the decustomizing signal F5 must be '1').

When the memory control unit is designated as a custom unit, since the decustomizing signal F5 is '1', if the manufacturer's ID input data write enable signal (rwe) is driven to '1', the register write enable signal WE goes to '1', which allows the manufacturer's ID input data rdata0 to rdata4 to be written into the registers of the manufacturer's ID register block 04.

When the memory control unit is designated as a general-purpose unit, since the decustomizing signal F5 is '0', the register write enable signal WE is always '0', which inhibits the writing of the manufacturer's ID input data rdata0 to rdata4 into the registers of the manufacturer's ID register block 04. Therefore, the output signals r0 to r4 of the manufacturer's ID register block 04 all remain '0'.

Figure 10A:
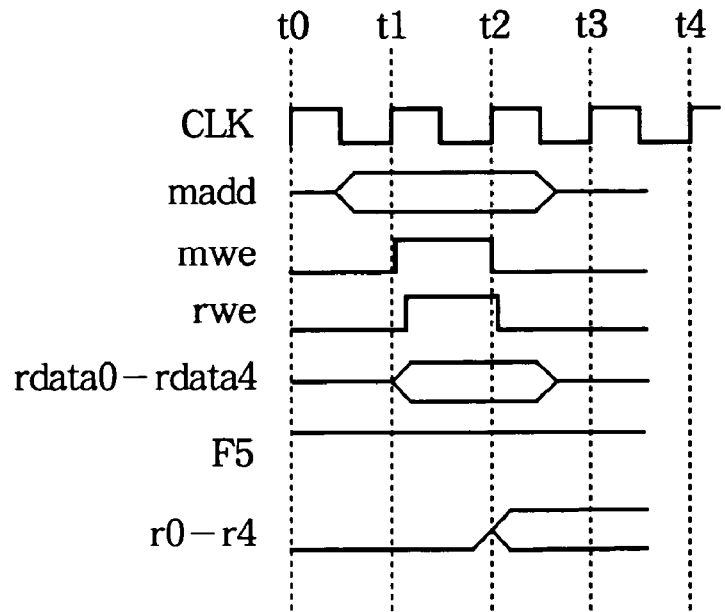
FIGS. 10A and 10B are timing diagrams illustrating the operation of the manufacturer's ID register block in FIG. 8.
Figure 10B:
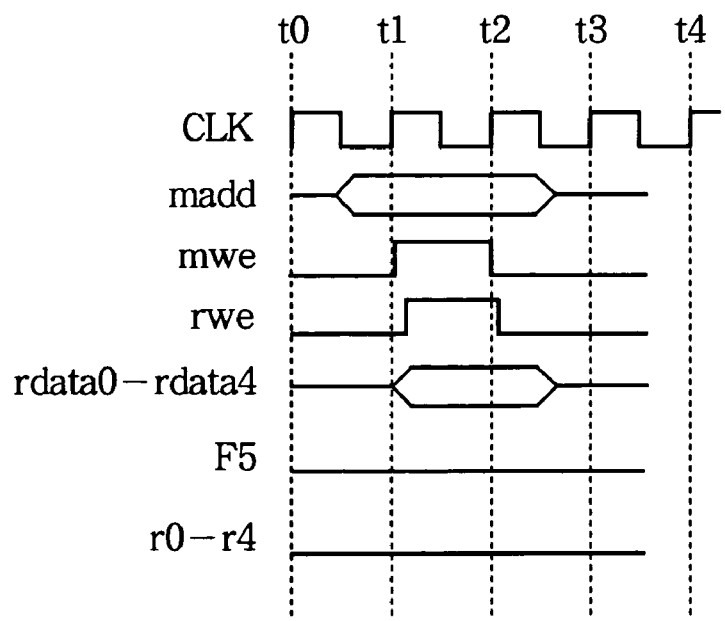

The operation of the manufacturer's ID register block 04 is illustrated in FIGS. 10A and 10B, which are timing diagrams for custom and general-purpose units, respectively.

In both of these drawings, during startup of the electronic equipment in which the microchip 200 is embedded, for example, a startup routine (startup program) is read and executed by a CPU disposed in the microchip 200 or another chip. In the startup routine, the CPU places the memory-mapped register address (madd) of the manufacturer's ID register block 04 on its address bus (not shown in the drawings), then asserts a memory write enable signal (mwe) at timing t1 and places the manufacturer's ID data (rdata0-rdata4) on the register data bus. The manufacturer's ID input data rdata0 to rdata4 are preset as part of the startup data in the startup program by the manufacturer of the electronic equipment. The manufacturer's ID input data write enable signal (rwe) input to the manufacturer's ID register block 04 goes high (goes from '0' to '1') slightly after the memory write enable signal (mwe).

In the custom unit illustrated in FIG. 10A, since the decustomizing signal F5 is '1', when the manufacturer's ID input data write enable signal (rwe) goes high ('1') at timing t1, the register write enable signal WE, which is input to the write enable terminals (we) of the flip-flops reg0 to reg4, also goes high, setting the flip-flops reg0 to reg4 to a writable state. The manufacturer's ID input data rdata0 to rdata4 are latched in the corresponding registers reg0 to reg4 at the rise of the clock signal (CLK) at timing t2, after which the output signals r0 to r4 of the flip-flops reg0 to reg4 correspond to the respective manufacturer's ID input data rdata0 to rdata4.

In the general-purpose unit illustrated in FIG. 10B, since the decustomizing signal F5 is '0', even though the manufacturer's ID input data write enable signal (rwe) goes high ('1') from timing t1 to timing t2, the register write enable signal WE output by the AND gate (AND21) remains '0'. Therefore, writing to the registers reg0 to reg4 remains inhibited, the manufacturer's ID input data rdata0 to rdata4 are not stored in the flip-flops reg0 to reg4 at timing t2, and the outputs r0 to r4 of the flip-flops reg0 to reg4 remain at their initial value of '0' (low).

As shown in FIG. 9, the part of the manufacturer's ID comparator 05 comprising the exclusive-NOR gates ExNOR10 to ExNOR14 and AND gate AND15 decides whether or not the register values of the manufacturer's ID register block 04 (output signals r0 to r4 of the manufacturer's ID register block 04) match the manufacturer's ID values (values of the manufacturer's ID signals F0 to F4) preset in the manufacturer's ID setting block 01. The exclusive-NOR gates ExNOR10 to ExNOR14 perform bit-wise exclusive-NOR operations on the manufacturer's ID preset in the manufacturer's ID setting block 01 and the data stored in the manufacturer's ID register block 04 and output '1' for the matching bits.

If the register values of the manufacturer's ID register block 04 match the manufacturer's ID preset in the manufacturer's ID setting block 01 in all bits, the outputs of the exclusive-NOR gates ExNOR10 to ExNOR14 are all '1', so the manufacturer's ID comparison result signal J0 output from the AND gate (AND15) goes high ('1'). Otherwise, the manufacturer's ID comparison result signal J0 remains low ('0').

When the memory control unit is designated as a general-purpose unit, since the manufacturer's ID input data rdata0 to rdata4 are not written into the manufacturer's ID register block 04, all bits output from the manufacturer's ID register block 04 are '0', which does not match the manufacturer's ID preset in the manufacturer's ID setting block 01. Therefore, the manufacturer's ID comparison result signal J0 remains low ('0').

As shown in FIG. 6, the CS terminal of the internal memory 10 directly receives the chip enable signal CS output by the memory controller 07, whereas the CS terminal of the internal memory 11 receives the signal obtained by gating the chip enable signal CS from the memory controller 07 with the manufacturer's ID comparison result signal J0 output by the manufacturer's ID decision block 06.

When the register values of the manufacturer's ID register block 04 and the manufacturer's ID preset in the manufacturer's ID setting block 01 all match, the manufacturer's ID comparison result signal J0 goes to '1', so that the chip enable signal CS from the memory controller 07 is fed through to the CS-terminal of the internal memory 11. Accordingly, when the chip enable signal CS is asserted ('1'), the internal memory 11 can be accessed.

If the register values of the manufacturer's ID register block 04 and manufacturer's ID preset in the manufacturer's ID setting block 01 do not match (the two always fail to match in a general-purpose unit), the manufacturer's ID comparison result signal J0 is '0', so that even if the chip enable signal CS output by the memory controller 07 is asserted ('1'), the output signal of the AND gate (AND20) remains '0', thereby disabling access to internal memory 11.

The microchip 200 including the memory control unit according to the second embodiment has, for example, a distribution model similar to the one in the first embodiment. The semiconductor device manufacturer has two customers (a first electronic equipment manufacturer and a second electronic equipment manufacturer) who require customized chips to protect proprietary data they will store in the internal memory, and other customers who do not require customized chips. The semiconductor device manufacturer assigns IDs to the first and second electronic equipment manufacturers and fabricates microchips 200 according to the second embodiment. Some of the fabricated microchips 200 will be shipped to the first electronic equipment manufacturer (first custom chips), others will be shipped to the second electronic equipment manufacturer (second custom chips), and others will be sold as general-purpose chips to other customers. In the first custom chips, the fuses in the manufacturer's ID setting block 01 are selectively blown according to the ID code assigned to the first electronic equipment manufacturer, and the fuse in the decustomizing block 02 is left intact. In the second custom chip, the fuses in the manufacturer's ID setting block 01 are selectively blown according to the different ID code assigned to the second electronic equipment manufacturer, and the fuse in the decustomizing block 02 is left intact. In the general-purpose chips, the fuse in the decustomizing block 02 is blown.

As in the first embodiment, the first and second custom chips and general-purpose chips are all fabricated by the same fabrication process; the fuses in the manufacturer's ID setting block 01 or decustomizing block 02 are selectively blown before shipment to differentiate the product types. The semiconductor device manufacturer supplies the first custom chips only to the first electronic equipment manufacturer, supplies the second custom chips only to the second electronic equipment manufacturer, and supplies the general-purpose chips to other electronic equipment manufacturers or sells them commercially.

The first electronic equipment manufacturer produces and distributes electronic products including the first custom chip, which is fuse-programmed with the first manufacturer's ID. Also embedded in these electronic products is a startup program that sets the first manufacturer's ID in the manufacturer's ID register block 04, and data or a program is written into the internal memory 11 to implement a first proprietary function of the first custom chip. Similarly, the second electronic equipment manufacturer produces and distributes electronic products including the second custom chip, which is fuse-programmed with the second manufacturer's ID. Also embedded in these electronic products is a startup program that sets the second manufacturer's ID in the manufacturer's ID register block 04, and data or a program is written into internal memory 11 to implement a second proprietary function of the second custom chip. Other electronic equipment manufacturers produce and distribute electronic products including the general-purpose chip.

The first and second electronic equipment manufacturers can store programs and other data in the internal memory 11 embedded in the microchip without risk of unauthorized copying of their products. If necessary, the first and second electronic equipment manufacturers can also change the custom chips supplied from the semiconductor device manufacturer to general-purpose chips by blowing the fuse in the decustomizing block 02 of the custom chips, and produce and distribute electronic equipment product with the general-purpose chip embedded.

As mentioned above, the output signals ID0 to ID4 of the manufacturer's ID decision block 06 can be used to control access to on-chip functions in the microchip 200 other than the functions shown in the drawings. For example, the ID0 signal may control access to an internal timer (not shown) so that access is disabled if ID0 is '0' and enabled if ID0 is '1'. In a similar fashion, the ID1 signal may control access to a first internal RAM; the ID2 signal may control access to a second internal RAM; the ID3 signal may control access to a first internal ROM; and the ID4 signal may control access to a second internal ROM. Different electronic manufacturers can thereby be supplied with microchips having different sets of enabled hardware features, even though all of the microchips come from the same fabrication line. The signals ID0 to ID4 may also be used as a password or personal identity number, for example, to protect confidential data stored in internal memory 11.

For these purposes, the semiconductor device manufacturer may supply microchips in which the fuses in the manufacturer's ID setting block 01 and decustomizing block 02 are all left intact to the first and second electronic equipment manufacturers and let them blow the fuses themselves, provided the semiconductor device manufacturer and electronic equipment manufacturers take care that microchips with all fuses left intact do not reach the open market, where they might be misused by third parties.

The memory (internal memory 11) including proprietary programs or data can be read only by a CPU that can set the correct manufacturer's ID in the manufacturer's ID register block 04. The data cannot be read correctly by a device not programmed to supply the correct ID data. Moreover, if the microchip 200 is designated as a general-purpose microchip, the data in internal memory 11 cannot be read at all.

As in the first embodiment, since blown fuses cannot be restored, a general-purpose microchip cannot be converted to a custom chip. Therefore, a manufacturer who purchases more custom chips than necessary can convert the unused chips to general-purpose chips by blowing the fuse in the decustomizing block 02 and release the chips on the general market without fear that the proprietary data in internal memory 11 may be revealed. Once the decustomizing fuse FUSE5 in the decustomizing block 02 has been blown, the manufacturer's ID input data cannot be written into the registers in the manufacturer's ID register block 04, so the manufacturer's ID comparison result signal J0 is always set to '0', permanently disabling access to whatever data or program is stored in internal memory 11.

In the second embodiment, as in the first embodiment, the same microchip can be made either into a custom chip by selectively blowing the fuses in the manufacturer's ID setting block 01 or a general-purpose chip by blowing the fuse in the decustomizing block 02. When producing custom chips and general-purpose chips, the semiconductor device manufacturer does not need to fabricate the different types of chips separately. The manufacturer can produce just one type of chip, and then customize or decustomize the chip by selectively blowing fuses. Customized microchips can therefore be manufactured at a reduced unit cost, as explained in the description of the first embodiment.

The length of the manufacturer's ID is not limited to the five-bit length shown in the second embodiment; an ID code of any length may be used.

The manufacturer's ID setting block 01 may be connected to external terminals of the microchip 200 to permit the manufacturer's ID code to be programmed by the electronic equipment manufacturer who purchases the microchip, as mentioned above. Alternatively, a structure in which the manufacturer's ID setting block 01 is not connected to the external terminals of the microchip 200 may be employed, to prevent tampering with the programmed ID; in this case the fuses must be programmed by the microchip manufacturer.

In a variation of the second embodiment, the manufacturer's ID comparison result signal J0 controls a write enable signal instead of a chip select signal. This variation is useful when the microchip 200 is a one-time programmable ROM or flash memory. That is, after writing data into a one-time programmable ROM or flash ROM, the intended manufacturer can convert the one-time programmable ROM or flash ROM to a general-purpose chip that can still be read but in which further writing is permanently disabled, by blowing the decustomizing fuse FUSE5, to prevent unwanted addition to or alteration of the written data.

In another variation of the second embodiment, the internal memory 11 which is disabled by the manufacturer's ID comparison result signal J0 is replaced by another device such as, for example, a synchronous serial interface.

Those skilled in the art will recognize that further variations are possible within the scope of the invention, which is defined in the appended claims.

What is claimed is:

1. A memory control unit for reading and writing data in a memory, comprising:
   a manufacturer's ID setting block having fuses that are selectively blown to set a manufacturer's identification code (ID);
   a decustomizing block having a fuse that is selectively blown or left intact to designate the memory control unit as a general-purpose unit or a custom unit, wherein when designated as a custom unit, the memory control unit uses the manufacturer's ID to protect the data in the memory;
   a memory controller outputting the data to be written in the memory and receiving the data read from the memory; and
   a scrambler inserted between the memory controller and the memory, wherein
   when the decustomizing block designates the memory control unit as a general-purpose unit, the scrambler sends the data output by the memory controller without alteration to the memory and sends the data read from the memory without alteration to the memory controller, and
   when the decustomizing block designates the memory control unit as a custom unit, the scrambler uses the manufacturer's ID output by the manufacturer's ID setting block to scramble the data output by the memory controller and sends the scrambled data to the memory, and uses the manufacturer's ID output by the manufacturer's ID setting block to descramble the data read from the memory and sends the descrambled data to the memory controller.

2. The memory control unit of claim 1, wherein:
   the memory controller also outputs address signals designating locations in the memory; and
   when the decustomizing block designates the memory control unit as a custom unit, the scrambler also uses the manufacturer's ID to scramble the address signals.

3. The memory control unit of claim 1, wherein the manufacturer's ID setting block outputs a first plurality of ID signals designating the manufacturer's ID and the decustomizing block outputs a decustomizing signal indicating whether the memory control unit is a general-purpose unit or a custom unit, further comprising a plurality of logic gates that combine each of the first plurality of ID signals with the decustomizing signal to generate a second plurality of ID signals, and provide the second plurality of ID signals to the scrambler.

4. The memory control unit of claim 3, wherein the scrambler comprises a plurality of logic gates that combine each bit of the data received the memory controller or the memory with one of the second plurality of ID signals.

5. The memory control unit of claim 1, wherein the memory control unit and the memory are disposed in separate semiconductor integrated circuit chips.

6. The memory control unit of claim 1, wherein the memory control unit is disposed in a single semiconductor integrated circuit chip.

7. A memory system including the memory control unit and the memory of claim 1.

8. The memory system of claim 7, wherein the memory system is disposed in a single semiconductor integrated circuit chip.

9. A memory control unit for reading and writing data in a memory, comprising:
   a manufacturer's ID setting block having fuses that are selectively blown to set a manufacturer's identification code (ID);
   a decustomizing block having a fuse that is selectively blown or left intact to designate the memory control unit as a general-purpose unit or a custom unit, wherein when designated as a custom unit, the memory control unit uses the manufacturer's ID to protect the data in the memory;
   a memory controller outputting an enable signal that enables the data to be read from and written into the memory;
   a manufacturer's ID register block storing an externally writable input ID; and
   a manufacturer's ID comparator for comparing the manufacturer's ID with the input ID and passing the enable signal to the memory only if the manufacturer's ID matches the input ID, wherein
   when the decustomizing block designates the memory control unit as a general-purpose unit, the manufacturer's ID register block stores a default value different from the manufacturer's ID.

10. The memory control unit of claim 9, wherein the decustomizing block outputs a decustomizing signal indicating whether the memory control unit is a general-purpose unit or a custom unit, and the manufacturer's ID register block uses the decustomizing signal as a write enable signal.

11. The memory control unit of claim 9, wherein the manufacturer's ID comparator comprises:
    a plurality of first logic gates that compare the manufacturer's ID and the input ID bit by bit to generate a plurality of matching signals;
    a second logic gate that combines the matching signals to generate a gating signal; and
    a third logic gate that uses the gating signal to gate the enable signal output by the memory controller.

12. The memory control unit of claim 11, wherein the memory controller is disposed in a semiconductor integrated circuit chip and the manufacturer's ID comparator further comprises a plurality of fourth logic gates that combine the gating signal with each bit of the manufacturer's ID to generate a plurality of signals used to enable and disable different functions in the semiconductor integrated circuit chip.

13. The memory control unit of claim 9, wherein the memory control unit is disposed in a single semiconductor integrated circuit chip.

14. The memory control unit of claim 13, wherein the memory is also disposed within the single semiconductor integrated circuit chip.

15. The memory control unit of claim 13, wherein the enable signal also enables the semiconductor integrated circuit chip to perform a function, other than access to the memory.

16. A memory system including the memory control unit and the memory of claim 9.

17. The memory system of claim 16, wherein the memory system is disposed in a single semiconductor integrated circuit chip.

* * * * *